(12) United States Patent
Neyer et al.

(10) Patent No.: US 11,652,027 B2
(45) Date of Patent: May 16, 2023

(54) VERTICAL TRANSISTORS WITH GATE CONNECTION GRID

(71) Applicant: SEMICONDUCTOR COMPONENTS INDUSTRIES, LLC, Phoenix, AZ (US)

(72) Inventors: Thomas Neyer, Munich (DE); Herbert De Vleeschouwer, Zulte (BE); Fredrik Allerstam, Solna (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/194,846

(22) Filed: Mar. 8, 2021

(65) Prior Publication Data

US 2022/0285248 A1 Sep. 8, 2022

(51) Int. Cl.
*H01L 23/482* (2006.01)
*H01L 21/768* (2006.01)
(Continued)

(52) U.S. Cl.
CPC .... *H01L 23/4824* (2013.01); *H01L 21/76895* (2013.01); *H01L 29/1095* (2013.01);
(Continued)

(58) Field of Classification Search
CPC ........... H01L 23/4824; H01L 21/76895; H01L 29/1095; H01L 29/1608; H01L 29/66068;
(Continued)

(56) References Cited

U.S. PATENT DOCUMENTS 7,915,672 B2  3/2011  Venkatraman
8,013,387 B2  9/2011  Yedinak et al.
(Continued)

FOREIGN PATENT DOCUMENTS

CN  111403341 A  7/2020

OTHER PUBLICATIONS

International Search Report and Written Opinion for PCT Application No. PCT/US2022/070659, dated May 19, 2022, 11 pages.
U.S. Appl. No. 17/248,426, filed Jan. 25, 2021.

*Primary Examiner* — Cuong B Nguyen
(74) *Attorney, Agent, or Firm* — Brake Hughes Bellermann LLP

(57) ABSTRACT

In a general aspect, a semiconductor device can include a plurality of vertical transistor segments disposed in an active region of a semiconductor region. The plurality of vertical transistor segments can include respective gate electrodes. A first dielectric can be disposed on the active region. An electrically conductive grid can be disposed on the first dielectric. The electrically conductive grid can be electrically coupled with the respective gate electrodes using a plurality of conductive contacts formed through the first dielectric. A second dielectric can be disposed on the electrically conductive grid and the first dielectric. A conductive metal layer can be disposed on the second dielectric layer. The conductive metal layer can include a portion that is electrically coupled with the respective gate electrodes through the electrically conductive grid using at least one conductive contact to the electrically conductive grid formed through the second dielectric.

20 Claims, 10 Drawing Sheets

(51) Int. Cl.
*H01L 29/10* (2006.01)
*H01L 29/16* (2006.01)
*H01L 29/66* (2006.01)
*H01L 29/739* (2006.01)
*H01L 29/78* (2006.01)

(52) U.S. Cl.
CPC .... *H01L 29/1608* (2013.01); *H01L 29/66068* (2013.01); *H01L 29/7395* (2013.01); *H01L 29/7397* (2013.01); *H01L 29/7802* (2013.01); *H01L 29/7813* (2013.01)

(58) Field of Classification Search
CPC ............. H01L 29/7395; H01L 29/7397; H01L 29/7813; H01L 29/417; H01L 29/41741; H01L 29/4238; H01L 29/66712–66734; H01L 29/7802–7815; H01L 21/823487; H01L 29/66666; H01L 29/7827–7828; H01L 29/78642; H01L 51/057; H01L 29/7812; H01L 29/7824
See application file for complete search history.

(56) References Cited

U.S. PATENT DOCUMENTS

| | | | |
|---|---|---|---|
| 8,530,304 | B2 | 9/2013 | Coppens et al. |
| 8,648,410 | B2 | 2/2014 | Coppens et al. |
| 9,293,526 | B2 | 3/2016 | Yedinak et al. |
| 9,601,351 | B2 * | 3/2017 | Fukui ................. H01L 29/7813 |
| 10,600,905 | B1 | 3/2020 | Venkatraman et al. |
| 2002/0093112 | A1 | 7/2002 | Nesbit et al. |
| 2009/0166731 | A1 | 7/2009 | Maruoka |
| 2013/0069143 | A1 | 3/2013 | Yeh et al. |
| 2014/0252466 | A1 | 9/2014 | Loechelt |
| 2021/0305051 | A1 | 9/2021 | Qiao et al. |

* cited by examiner

VERTICAL TRANSISTORS WITH GATE CONNECTION GRID

TECHNICAL FIELD

This description relates to power transistors. More specifically, this disclosure relates to vertical transistors that are implemented using a gate connection grid.

BACKGROUND

Vertical transistors, such as vertical power transistors implemented in semiconductor die, are used in a wide variety of applications. These applications include industrial applications, consumer electronic applications, and so forth. In some implementations, metal tracks or runners can be included in a semiconductor device including a power transistor, where such metal tracks or runners can be used to route control signals (e.g., a gate signal) for the transistor.

There are, however, certain drawbacks associated with the use of such metal tracks. For instance, areas of the semiconductor die used to route the metal tracks may not be used to implement active portions of the device, which can reduce active area of an associated transistor, relative to available semiconductor die area, by up to 15% in some implementations. In some technologies, such as silicon carbide (SiC), gallium nitride, (GaN), etc., such reduction in active area can significantly increase product cost due, at least, to the cost of semiconductor wafers used for producing such transistors. Also, routing of such metal tracks for gate connections can require interrupting metal routing for other transistor connections, such as source metal routing for vertical field-effect transistors (FETs), and/or emitter metal routing for insulated gate bipolar transistors (IGBTs). Such interruptions in metal routing can increase associated resistance and/or can complicate forming electrical connections, such as wire bonds or conductive clips, when packing an associated semiconductor die.

SUMMARY

In a general aspect, semiconductor device can include a vertical transistor having a first transistor segment and a second transistor segment. The first transistor segment can include a first body region, a first source region, and a first gate electrode. The second transistor segment can include a second body region, a second source region, and a second gate electrode. The semiconductor device can further include a first dielectric layer disposed on the vertical transistor, and an electrically conductive grid disposed on the first dielectric layer. The electrically conductive grid can be electrically coupled with the first gate electrode and the second gate electrode using at least a first conductive contact formed through the first dielectric layer. The semiconductor device can also include a second dielectric layer disposed on the electrically conductive grid and the first dielectric layer, and a conductive metal layer disposed on the second dielectric layer. The conductive metal layer can include a first portion and a second portion. The first portion can be electrically coupled with the first body region, the first source region, the second body region, and the second source region using at least a second conductive contact formed through the first dielectric layer and the second dielectric layer. The second portion can be electrically coupled with the electrically conductive grid using at least a third conductive contact formed through the second dielectric layer.

In another general aspect, a semiconductor device can include a semiconductor region, an active region disposed in the semiconductor region, and an isolation region disposed in the semiconductor region. The isolation region can at least partially surround the active region. The semiconductor device can also include a plurality of vertical transistor segments disposed in the active region. The plurality of vertical transistor segments can include respective gate electrodes. The semiconductor device can also include a first dielectric layer disposed on the active region, and an electrically conductive grid disposed on the first dielectric layer. The electrically conductive grid can be electrically coupled with the respective gate electrodes using a plurality of conductive contacts formed through the first dielectric layer. The semiconductor device can further include a second dielectric layer disposed on the electrically conductive grid and the first dielectric layer, and a conductive metal layer disposed on the second dielectric layer. The conductive metal layer can include a portion that is electrically coupled with the respective gate electrodes through the electrically conductive grid using at least one conductive contact to the electrically conductive grid formed through the second dielectric layer.

In another general aspect, a method for producing a semiconductor device can include forming, in a semiconductor region, a vertical transistor. The vertical transistor can include a first transistor segment and a second transistor segment. The first transistor segment can have a first body region, a first source region, and a first gate electrode. The second transistor segment can have a second body region, a second source region, and a second gate electrode. The method can further include forming a first dielectric layer on the vertical transistor, and forming an electrically conductive grid on the first dielectric layer. The electrically conductive grid can be electrically coupled with the first gate electrode and the second gate electrode using at least a first conductive contact formed through the first dielectric layer. The method can also include forming a second dielectric layer on the electrically conductive grid and the first dielectric layer, and forming a conductive metal layer on the second dielectric layer. The conductive metal layer can include a first portion that can be electrically coupled with the first body region, the first source region, the second body region, and the second source region using at least a second conductive contact formed through the first dielectric layer and the second dielectric layer. The conductive metal layer can also include a second portion that can be electrically coupled with the electrically conductive grid using at least a third conductive contact formed through the second dielectric layer.

Figure 1A:
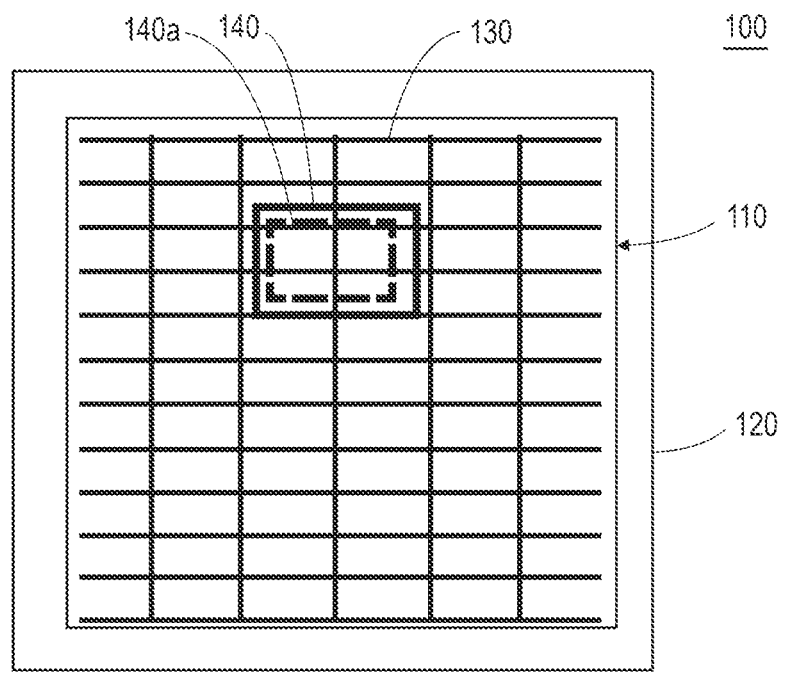
FIGS. 1A and 1B are diagrams that schematically illustrate a semiconductor device that includes a gate connection grid.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to vertical transistor implementations. For purposes of illustration and discussion, the examples illustrated herein are generally described with respect to n-channel vertical transistors implemented with planar-gate electrodes. However, in some implementations, such as the implementations of FIGS. 3 and 10, the approaches described herein can be implemented in vertical transistors that include trench-gate electrodes. Also, in some implementations, the semiconductor conductivity types discussed herein can be reversed (e.g., n-type and p-type conductivities can be reversed to produce p-channel vertical transistors).

The implementations described herein can address at least some of the drawbacks of current implementations noted above. For instance, the implementations described herein include a gate connection grid to provide low resistance electrical connections to gate electrodes, e.g., doped polysilicon gate electrodes of an associated transistor, such as a vertical power transistor. Use of such a gate connection grid allows for metal tracks or runners for carrying gate control signals to be excluded, or eliminated from power transistors that are implemented in a semiconductor die. Accordingly, an active area of an associated transistor, as compared to available semiconductor die area, can be increased to one-percent, or nearly one-hundred percent of available semiconductor die area. In some implementations, available semiconductor die area can be an semiconductor area within an isolation, or termination region of a corresponding semiconductor die. Such an isolation, or termination region, which can be disposed around at least a portion of a perimeter of a corresponding semiconductor die, can help regulate breakdown voltage of an associated power transistor. For instance, such an isolation region can prevent breakdown from occurring below a rated voltage of the transistor, e.g., by terminating high electric fields during operation of the transistor.

Also, in the example implementations described herein, because a metal track or runner is not used to carry electrical signals, e.g. gate control signals, of a power transistor, signal metal for other connections to the transistor, such as source and/or emitter connections can be continuous. That is, breaks in signal metal to accommodate routing of such metal tracks are avoided in the implementations described herein, because such metal runners are not used. This allows for an associated area of source and/or emitter signal metal to be increased, which can, in turn, increase current carrying capability and improve performance of an associated transistor, e.g., for a same die size as current implementations, and can also simplify making electrical connections, such as electrical clip or wire bond connections, to the signal metal when packaging the device for use.

The approaches described herein can also provide other advantages. For instance, in some implementations, resistance of a gate connection internal to an associated semiconductor can be easily adjusted, or tuned with accuracies in the milli-ohm range. Such adjustment can be achieved as a result of a number of electrical contacts that are made between a gate connection grid (e.g., a tungsten, or other metal grid) and gate electrodes (e.g., doped polysilicon gate electrodes) of segments of a transistor. Also, use of a gate connection grid, and elimination of gate metal tracks or runners can allow for field oxide formation in an associated semiconductor process to be exclude, as such field oxide can be used for electrical isolation of metal gate tracks in current approaches. For purposes of this disclosure, a gate connection grid can also be referred to as an electrically conductive grid, or a conductive grid.

Figure 1B:
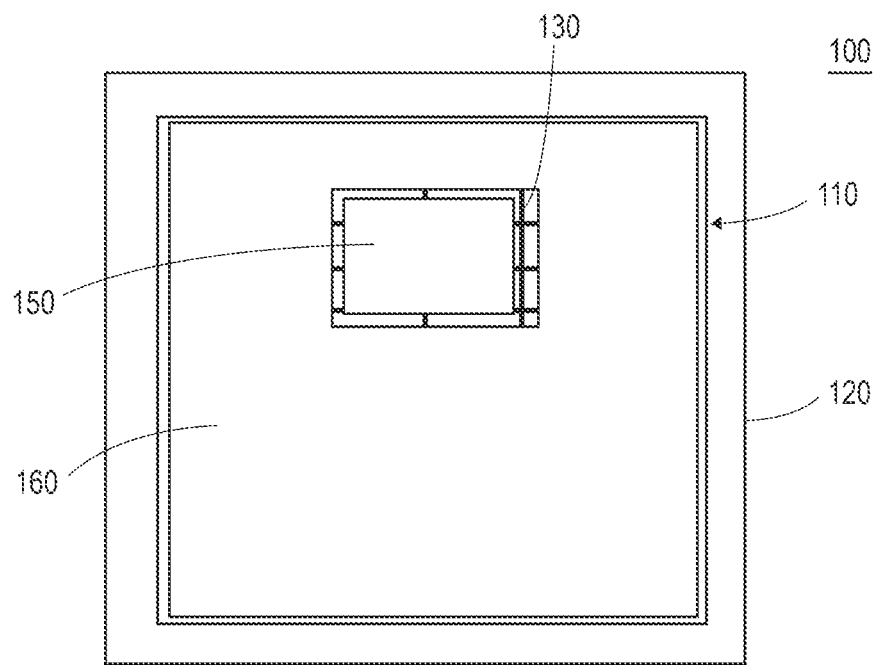

FIGS. 1A and 1B are diagrams that schematically illustrate a semiconductor device 100 that includes a gate connection grid 130. In this example, the semiconductor device 100 includes an active area 110 and an isolation, or a termination region 120. In this example, the termination region 120 surround the active area 110. That is the termination region 120 defines an outer perimeter of the active area 110. In some implementations, the termination region 120 can include implants and/or trench structures to terminate electricals fields associated with operation of a transistor implemented in the active area 110 of the semiconductor device 100.

As shown in FIG. 1A, the semiconductor device 100 includes a gate connection grid 130 and gate pad area 140 that are disposed in the active area 110. In this example, the gate connection grid 130 includes regularly arranged rows and columns of electrically conductive material, which can be implemented with tungsten or other metal materials. That is, in the implementations described herein, a gate connection grid (an electrically conductive grid) can include a matrix of rows and columns of electrically conductive material. In some implementations, a gate connection grid can have other arrangements. For instance, the rows and columns can be irregularly spaced, can be segmented, etc. The specific arrangement of a gate connection grid, such as the gate connection grid 130, will depend on the particular implementation. As illustrated in FIG. 1A, the gate connection grid 130 can extend over all of, or nearly all of the active area 110, with appropriate spacing from the active area 110 for an associated semiconductor process. The arrangement of the gate connection grid 130 allows for low resistance connections from the gate connection grid 130 to gate electrodes of transistors segments, which are disposed below the gate connection grid 130, of an associated transistor included in the active area 110. For example, as noted above, the gate connection grid 130 can be implemented using tungsten, which is approximately one-hundred times less resistive than doped polysilicon.

The semiconductor device 100 also includes a gate pad area 140 and a gate pad connection area 140a. As shown in FIG. 1A, the gate pad connection area 140a can have a smaller area than the gate pad area 140. In this example, gate pad metal 150, which can be part of a signal distribution layer of the semiconductor device 100 can be disposed in the gate pad area 140, such as shown in FIG. 1B. The gate pad metal 150 can, in the gate pad connection area 140a, be electrically coupled with the gate connection grid 130, e.g., using another metal layer, conductive vias and/or conductive contacts, such as in the approaches described herein. Accordingly, in this example, the gate pad metal 150 can be electrically coupled with gate electrodes of an associated transistor of the semiconductor device 100 through the gate connection grid 130, as well as through electrical connections between the gate connection grid 130 and the gate electrodes, and electrical connections between the gate pad metal 150 and the gate connection grid 130. Also in this example, as shown in FIG. 1B, source pad metal 160, which can be part of the distribution layer that includes the gate pad metal 150, can be disposed on, or over portions the active area 110 not covered with the gate pad metal 150, where the source pad metal 160 is appropriately spaced from the gate pad metal 150 and the termination region 120.

In such approaches, because metal gate tracks have been eliminated, the entire active area 110 of the semiconductor device 100, with appropriate spacing from the termination region 120, can include active transistor segments. Accordingly, area previously used to implement metal gate tracks can be eliminated or used for active transistor area. Therefore, a semiconductor die with a smaller area can be used to produce a semiconductor device with a transistor active area that is equivalent to a transistor active area of a semiconductor device that includes metal gate tracks. That is, area for implementing gate metal tracks can be eliminated and a corresponding die size can be reduced by an amount of area used to implement such gate metal tracks (e.g., up to 15% of an associated active area). Said another way, in some implementations, a gate connection grid, such as the example implementations described herein, may not reduce an active area, within an active region, of a corresponding semiconductor device, such as the vertical transistors described herein.

Figure 2:
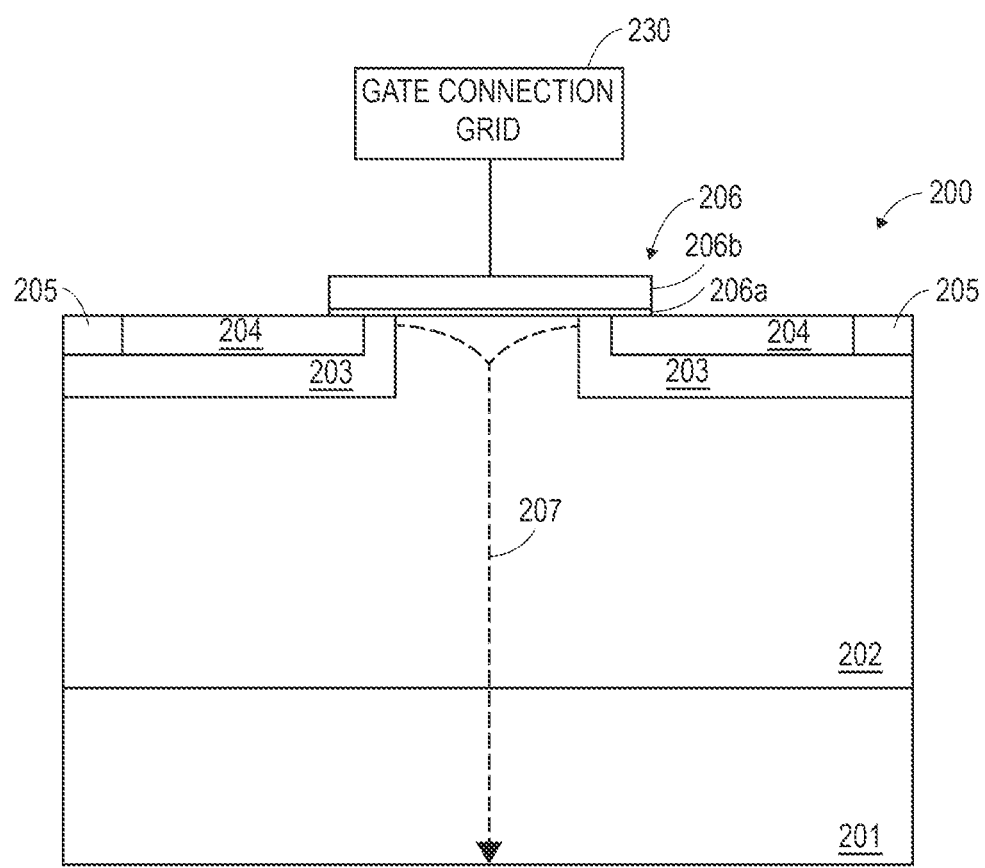
FIG. 2 is a diagram that schematically illustrates a cross-sectional view of vertical transistor segment with a planar-gate electrode that is coupled with a gate connection grid.

FIG. 2 is a diagram that schematically illustrates a cross-sectional view of vertical transistor segment 200 with a planar-gate that is coupled with a gate connection grid 230. The vertical transistor segment 200 can extend in and out of the page in a third dimension. In some implementations, a plurality of the vertical transistor segment 200 shown in FIG. 2 can be included in a semiconductor die, and the gate connection grid 230 can be used to electrically couple the respective gate electrodes together to implement a vertical transistor that includes the plurality of vertical transistor segments. Depending on the specific arrangement of elements of the vertical transistor segment 200, and/or a doping profile of elements of the vertical transistor segment 200, the vertical transistor segment 200 can implement a vertical field-effect transistor (FET), or an insulated gate bipolar transistor (IGBT). By way of example, the vertical transistor segment 200 is generally described as a vertical FET.

In the example implementation of the FIG. 2, the vertical transistor segment 200 includes a substrate 201, which can be a heavily doped n-type substrate, such as a SiC substrate, or another semiconductor substrate. The vertical transistor segment 200 also includes an epitaxial layer 202, which can be an n-type epitaxial layer with a doping concentration that is less a doping concentration of the substrate 201. In this example implementation, the substrate 201 can include, or implement a drain terminal of the vertical transistor segment 200 (or a collector terminal in an IGBT implementation). The epitaxial layer 202 can implement a drift region of the vertical transistor segment 200. The line 270 in FIG. 2 indicates a majority carrier flow direction for the vertical transistor segment 200, when in an on-state during operation. In this example, the majority carrier flow would be electrons, though would be holes if conductivity types of the vertical transistor segment 200 were reversed, switching n-type and p-type conductivities.

As also shown in FIG. 2, the vertical transistor segment 200 can include body regions 203, which can be p-type well regions that can also referred to as bulk regions. Source regions 204 (emitter regions for an IGBT implementation) can be disposed, respectively, in the body regions 203. In this example, the source regions 204 can be heavily doped n-type implants. The vertical transistor segment 200 can further include heavy body regions 205 (or sub-contact regions) that are disposed, respectively, in the body regions 203. The heavy body regions 205 can be heavily doped p-type implants that facilitate formation of ohmic contacts from a source signal metal layer (or emitter signal metal layer for an IGBT implementation) to the body regions 203, where the source signal metal can also form ohmic contacts to the source regions 204.

The vertical transistor segment 200 also includes a gate structure 206. The gate structure 206 includes a gate dielectric 206a and a gate electrode 206b. The gate structure 206, as shown in FIG. 2 extends between the source regions 204, partially extending over each of the source regions 204. In operation, applying an appropriate bias to the gate electrode 206b of the gate structure 206 forms a conduction channel from the source regions 204, through the body regions 203 to the epitaxial layer 202 (e.g., to the drift region of the vertical transistor segment 200). As was noted above, the gate structure 206, specifically the gate electrode 206b, can be electrically coupled with the gate connection grid 230, examples of which are described herein, and the gate connection grid 230 can be coupled to gate structures of additional vertical transistor segments, e.g., replicated instances of the vertical transistor segment 200.

In some implementations, instances of the vertical transistor segment 200 can be replicated throughout the active area 110 of the semiconductor device 100, such that all of, or nearly all of the active area 110 is occupied with the replicated vertical transistor segments. In this example, replicated transistor segments nearest the termination region 120 can be appropriately spaced from the termination region 120. Electrical interconnections between such vertical transistor segments can be implemented using the approaches described herein. For instance, gate structures (gate structure 206) of such transistor segments can be interconnected through the gate connection grid 230, while the body regions 203, the source regions 204 and the heavy body regions 205 can be interconnected through a conductive metal layer.

Figure 3:
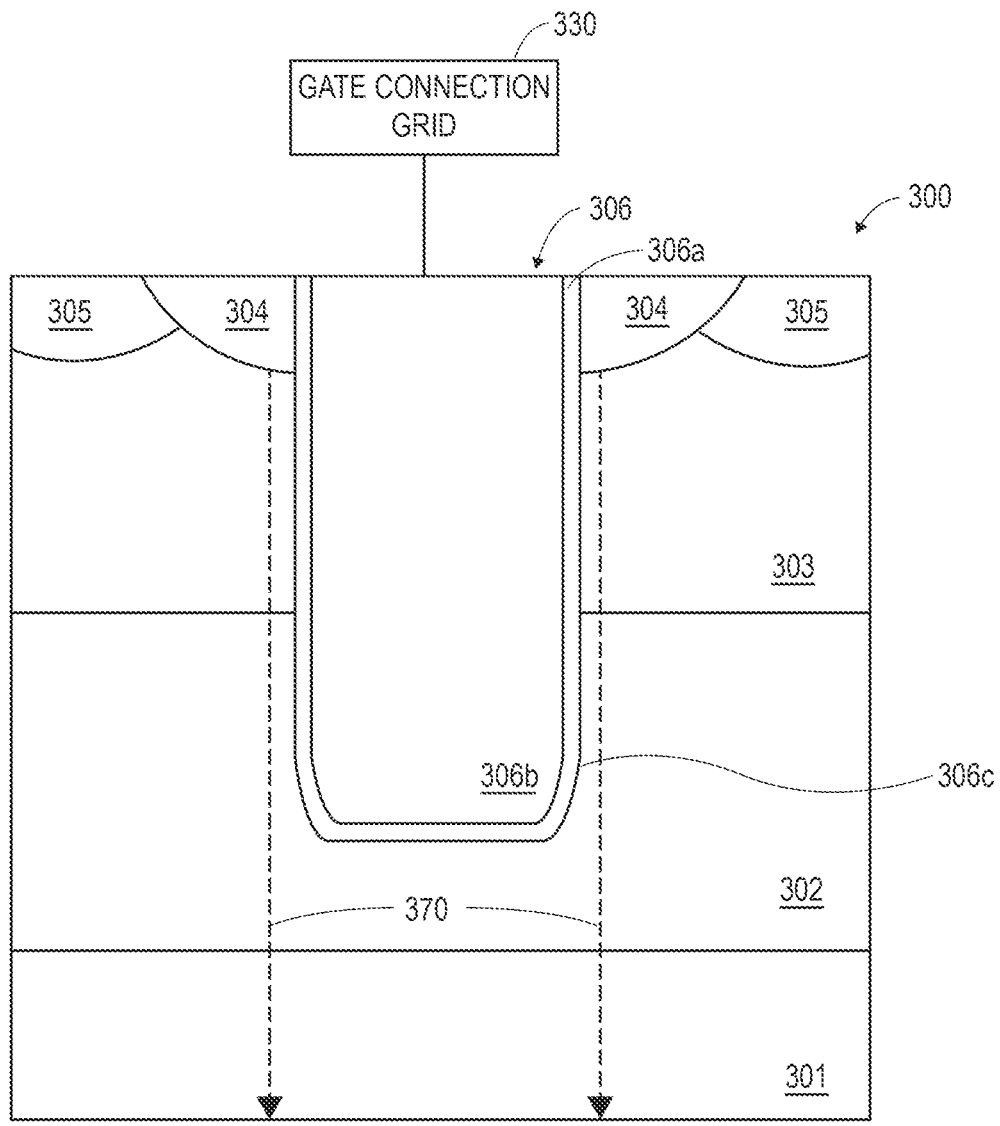
FIG. 3 is a diagram that schematically illustrates a cross-sectional view of a vertical transistor segment with a trench-gate electrode that is coupled with a gate connection grid.

FIG. 3 is a diagram that schematically illustrates a cross-sectional view of vertical transistor segment 300 with a trench-gate that is coupled with a gate connection grid 330. The vertical transistor segment 300, as with the vertical transistor segment 200, can extend in and out of the page in a third dimension. In some implementations, a plurality of the vertical transistor segment 300 shown in FIG. 3 can be included in a semiconductor die, and the gate connection grid 330 can be used to electrically couple the respective gate electrodes together to implement a vertical transistor that includes the plurality of vertical transistor segments. Depending on the specific arrangement of elements of the vertical transistor segment 300, and/or a doping profile of elements of the vertical transistor segment 300, the vertical transistor segment 300 can implement a vertical field-effect transistor (FET), or an insulated gate bipolar transistor (IGBT). By way of example, the vertical transistor segment 300 is generally described as a vertical FET.

In the example implementation of the FIG. 3, the vertical transistor segment 300 includes a substrate 301, which can be a heavily doped n-type substrate, such as a SiC substrate, or another semiconductor substrate. The vertical transistor segment 300 also includes an epitaxial layer 302, which can be an n-type epitaxial layer with a doping concentration that is less a doping concentration of the substrate 301. In this example implementation, the substrate 301 can include, or implement a drain terminal of the vertical transistor segment 300 (or a collector terminal in an IGBT implementation). The epitaxial layer 302 can implement a drift region of the vertical transistor segment 300. The lines 370 in FIG. 3 indicate a majority carrier flow direction for the vertical transistor segment 300, when in an on-state during operation. In this example, the majority carrier flow would be electrons, though would be holes if conductivity types of the vertical transistor segment 300 were reversed, switching n-type and p-type conductivities.

As also shown in FIG. 3, the vertical transistor segment 300 can further include a body region 303, which can be a p-type well region formed in the epitaxial layer 302. The body region 303 can also referred to as a bulk region. Source regions 304 (emitter regions for an IGBT implementation) can be disposed, respectively, in the body region 303, and adjacent to a trench-gate structure 306. In this example, the source regions 304 can be heavily doped n-type implants. The vertical transistor segment 300 can further include heavy body regions 305 (or sub-contact regions) that are disposed in the body region 303, and respectively adjacent to the source regions 304. The heavy body region 305 can be a heavily doped p-type implant that facilitates formation of ohmic contacts from a source signal metal layer (or emitter signal metal layer for an IGBT implementation) to the body regions 303, where the source signal metal can also form ohmic contacts to the source regions 304.

As noted above, the vertical transistor segment 300 also includes the trench-gate structure 306. The trench-gate structure 306 includes a gate dielectric 306a, and a gate electrode 306b, where the gate dielectric 306a lines a trench 306c, and the 306b is disposed within the gate dielectric 306a. The gate structure 306, e.g., the trench 306c, as shown in FIG. 3 extends through the body region 303 into the n-type portion of the epitaxial layer 302. In some implementations the trench can extend into the substrate 301. In operation, applying an appropriate bias to the gate electrode 306b of the gate structure 306 forms a conduction channel from the source regions 304, through the body regions 303 to the n-type portion of the epitaxial layer 302 (e.g., to the drift region of the vertical transistor segment 300). As was noted above, the gate structure 306, specifically the gate electrode 306b, can be electrically coupled with the gate connection grid 330, examples of which are described herein, and the gate connection grid 330 can be coupled to gate structures of additional vertical transistor segments, e.g., replicated instances of the vertical transistor segment 300.

In some implementations, instances of the vertical transistor segment 300 can be replicated throughout the active area 110 of the semiconductor device 100, such that all of, or nearly all of the active area 110 is occupied with the replicated vertical transistor segments. In this example, replicated transistor segments nearest the termination region 120 can be appropriately spaced from the termination region 120. Electrical interconnections between such vertical transistor segments can be implemented using the approaches described herein. For instance, gate structures (gate structure 306) of such transistor segments can be interconnected through the gate connection grid 330, while the body regions (body region 303), the source regions 304 and the heavy body regions 305 can be interconnected through a conductive metal layer.

Figure 4:
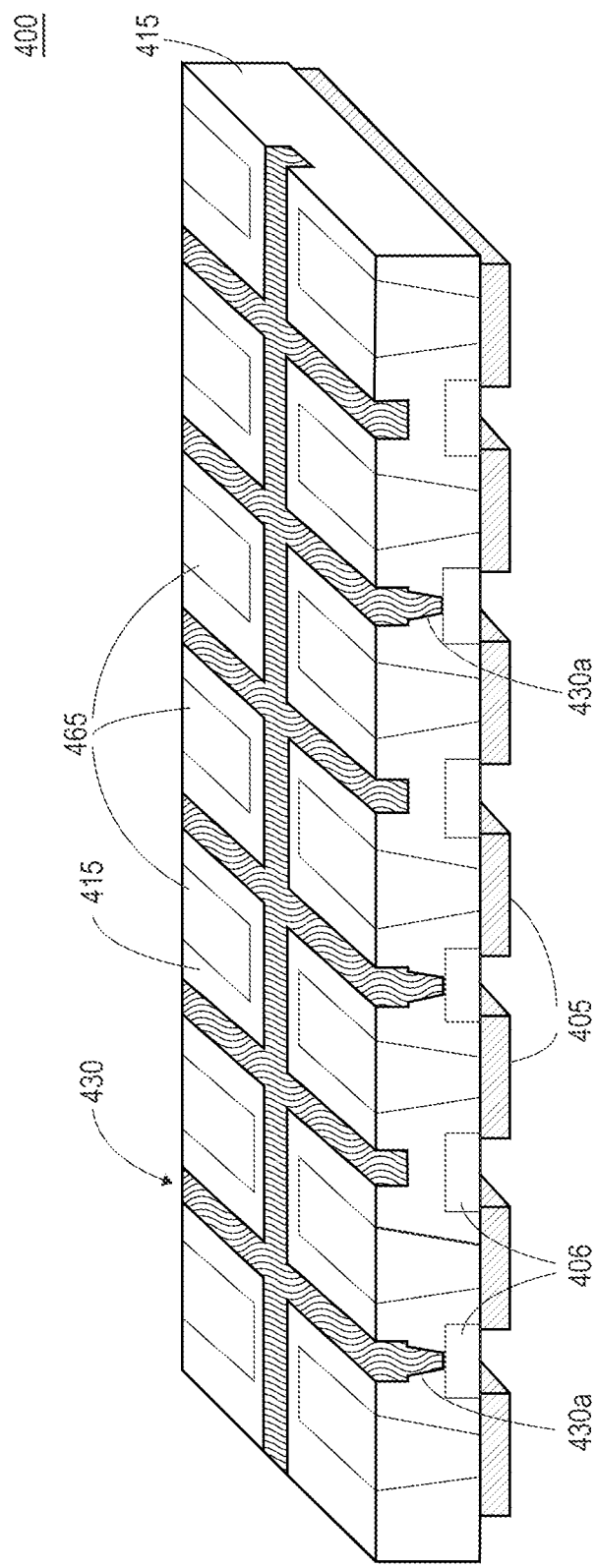
FIG. 4 is a diagram that illustrates a portion of a semiconductor device implementing a vertical transistor that includes a gate connection grid.

FIG. 4 is an isometric diagram that illustrates a portion of a semiconductor device 400 implementing a vertical transistor that includes a gate connection grid 430. The portion of the semiconductor device 400 illustrated in FIG. 4 is given by way of example, to illustrate an example arrangement of the gate connection grid 430 and connection of the gate connection grid 430 to gate structures 406 of corresponding vertical transistor segments. In the example of FIG. 4, underlying semiconductor regions, such as a substrate and/or an epitaxial layer, are not specifically shown. Additionally, other elements of the semiconductor device 400 are not shown in FIG. 4, so as not to obscure the illustrate structure. Such elements can include dielectric layers, metal layers, vias, and so forth, that can be used to implement interconnections between vertical transistor segments of the semiconductor device 400, an can be disposed on the upper surface of the portion of the semiconductor device 400 as shown in FIG. 4. Also in FIG. 4, for purposes of illustration, body regions, heavy body regions and source (or emitter) regions are shown as respective single regions, which are referred to herein as source/body regions 405. The arrangement of respective source (or emitter) regions in the source/body regions 405 can be similar to the arrangement shown in FIG. 2 for the source regions 204 in the body regions 203.

As shown in FIG. 4, the semiconductor device 400 includes gate structures 406, which can be similar to the gate structure 206 shown in FIG. 2, and disposed on a semiconductor region in which the source/body regions 405 are disposed. In the semiconductor device 400, a dielectric layer 415 can be disposed on the gate structures 406. The dielectric layer 415 can electrically isolate the gate structure 406 from the gate connection grid 430, except where contacts 430a are formed between the gate structures 406 and the gate connection grid 430. In some implementations, the gate structures 406 can all be electrically coupled with each other, either through the gate connection grid 430 and contacts 430a, and/or through doped polysilicon that is used to form gate electrodes of the gate structures 406. In such implementations, the gate structures 406 can function as a single transistor gate for a transistor that includes corresponding transistor segments.

In this example, the gate connection grid 430 can be disposed on the dielectric layer 415 (e.g., on an upper surface of the dielectric layer 415), or in a recess formed in the dielectric layer 415. Such a recessed pattern can be formed using photolithography techniques. As also shown in FIG. 4, the contacts 430a can be formed through the dielectric layer 415, to electrically couple the gate connection grid 430 with one or more of the gate structures 406. As discussed above, in some implementations, the gate connection grid 430 and the contacts 430a can be formed using tungsten, and/or other electrically conductive, low resistance metal materials. As with other elements of the transistor segments of the semiconductor device 400, the contacts 430a can extend in and out of the page. Further, contacts 430a between the gate connection grid 430 and the gate structures 406 can be formed at different locations of the gate connection grid 430, such as locations that are located into, or out of the page in FIG. 4. Accordingly, such contacts are not visible in FIG. 4.

As further shown in FIG. 4, electrical contacts 465 to the source/body regions 405 can be made through the dielectric layer 415, where the contacts 465 extend through openings the gate connection grid 430 and are spaced from the gate connection grid 430. In the semiconductor device 400, the electrical contacts 465 can extend upward from the illustrated portion of the semiconductor device 400, such as through a second dielectric layer. For instance, as shown for electrical contacts 965 in FIGS. 9E-9G, the electrical contacts 465 can electrically couple a source/body signal metal layer with the body regions 405.

Figure 5:
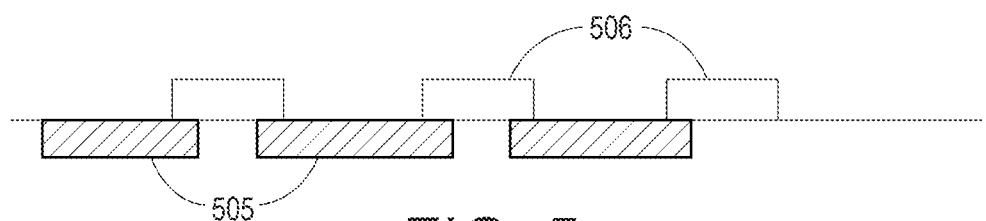
FIG. 5 is a diagram that schematically illustrates gate electrodes of a vertical transistor and associated bulk/body and source/emitter regions.

FIG. 5 is a cross-section diagram that schematically illustrates gate electrodes 506 of a vertical transistor and associated bulk/body and source/emitter regions, which are referred to as source/body regions 505. As in FIG. 4, the underlying semiconductor regions (e.g., substrate and/or epitaxial layer) are not shown in FIG. Also, as with the source/body regions 405, the source/body regions 505 in FIG. 5, can be similarly arranged with the gate electrodes 506 as the body regions 203, the source regions 204 and the heavy body regions 205 are arranged with the gate structure 206 of the vertical transistor segment 200. The cross-sectional view of FIG. 5 also schematically illustrates section views the gate electrodes and source/body regions of the example implementations of FIGS. 6-8 along section lines 5-5 shown in each of those figures, which are each described below.

Figure 6:
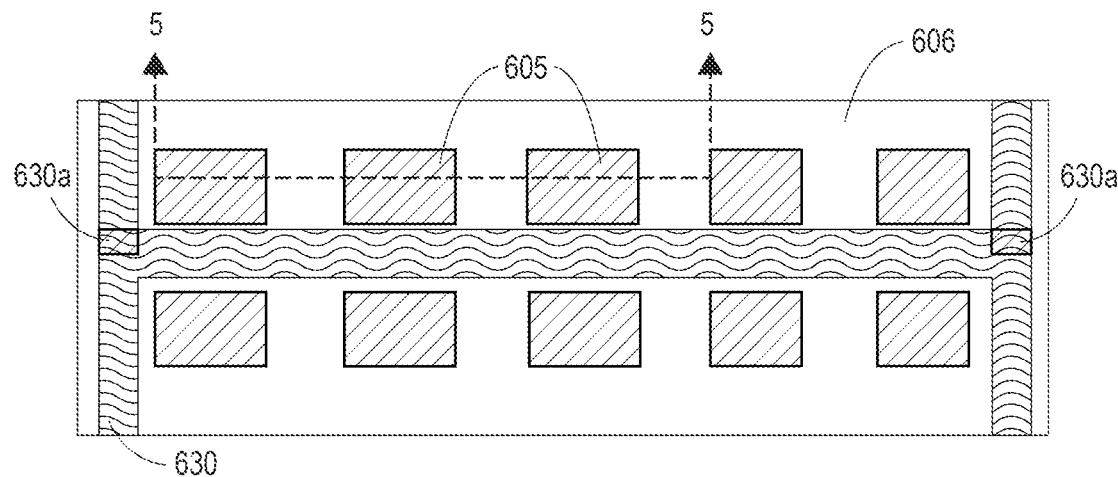
FIGS. 6-8 are diagrams schematically illustrating various arrangements of vertical transistor planar-gate electrodes and associated bulk/body and source/emitter regions.
Figure 7:
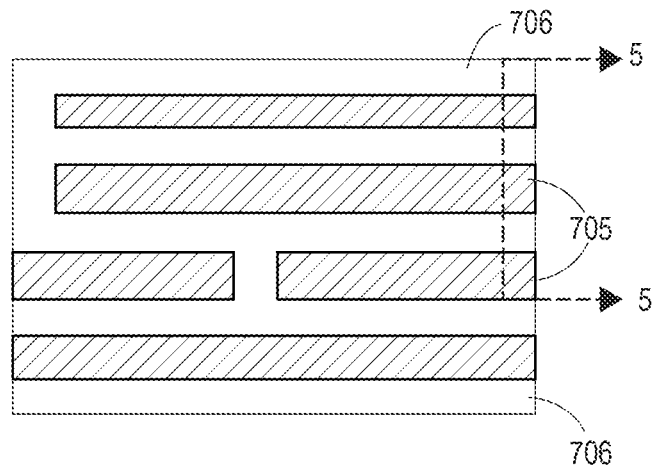
Figure 8:
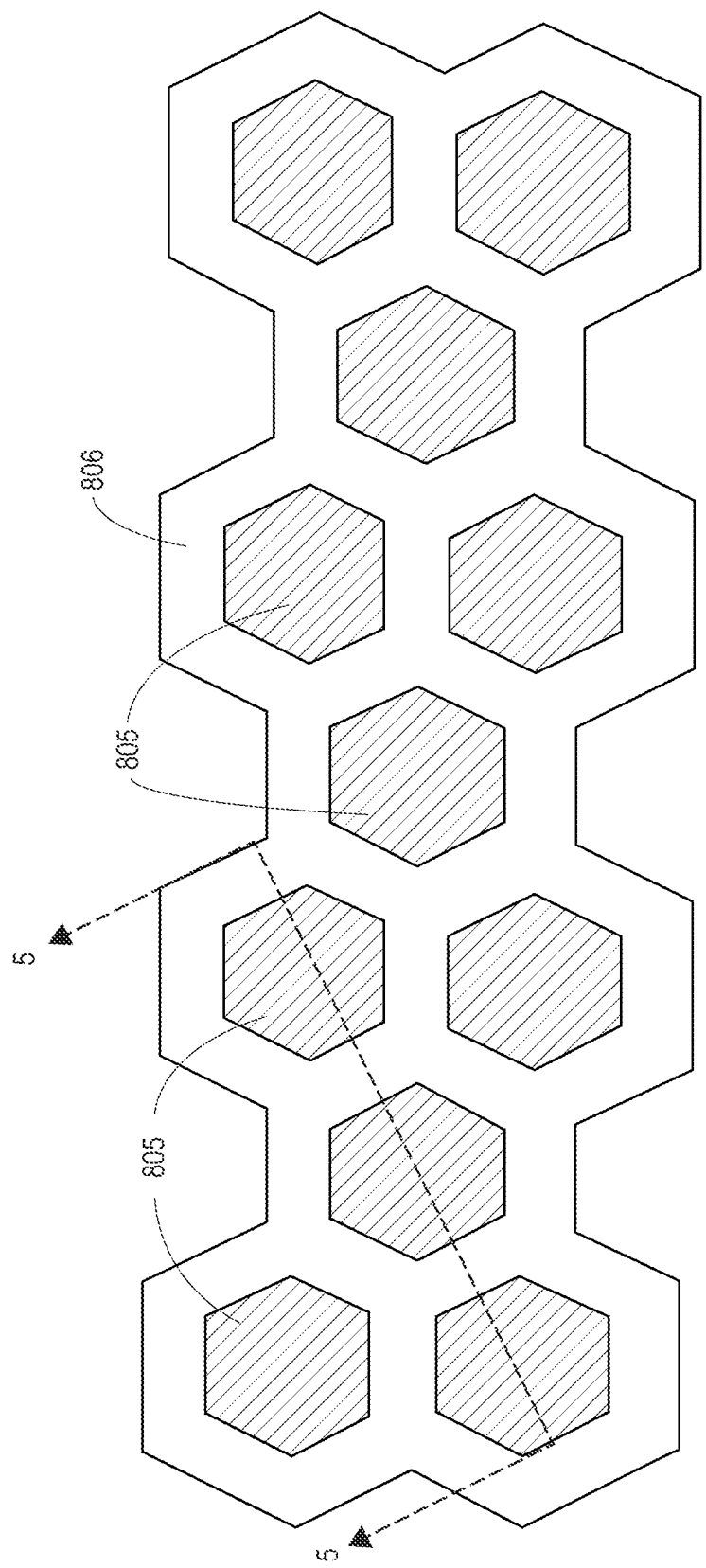

Specifically, FIGS. 6-8 are diagrams schematically illustrating various arrangements of vertical transistor planar-gate electrodes and associated bulk/body and source/emitter regions that can be included in a vertical transistor. In each of the FIGS. 6-8, as with FIGS. 4 and 5, source/body regions are shown that can be similarly arranged with their corresponding gate electrodes as the body regions 203, the source regions 204 and the heavy body regions 205 of the 200 are arranged with respect to the gate electrode 206.

For instance, FIG. 6 illustrates a portion of a gate electrode 606 (a waffle-shaped gate electrode) that includes openings through which source/body regions 605 are exposed. The gate electrode 606 of FIG. 6 can be referred to as a fully-connected gate electrode, as the gate electrode 606 can be formed from a continuous doped polysilicon feature. Electrical contacts to the source/body regions 605 can be made through the openings in the gate electrode 606. The section line 5-5 in FIG. 6 indicates a portion of the source/body regions 605 and the gate electrode 606 that corresponds with the cross-sectional view of FIG. 5. Also shown in FIG. 6 is a portion of a gate connection grid 630 and contacts 630a from the gate connection grid 630 to the gate electrode 606. Accordingly, segments of the gate electrode 606, in this example implementation, can be electrically coupled with each both through doped polysilicon of the gate electrode 606, and through the gate connection grid 630.

FIG. 7 illustrates gate electrodes 706 of a portion of a vertical transistor. As shown in FIG. 7, the gate electrodes 706 are generally arranges as stripes, where some adjacent stripes are interconnected. That is, some adjacent stripes of the gate electrodes 706 in FIG. 7 can be formed using a continuous doped polysilicon feature, while other adjacent stripes of the gate electrodes 706 can be formed as separate doped polysilicon features. As shown in FIG. 7, source/body regions 705 are exposed through spaces between adjacent stripes, and electrical contacts to the source/body regions 605 can be made along the spaces between the gate electrodes 706. As with the section line 5-5 in FIG. 6, the section line 5-5 in FIG. 7 indicates a portion of the source/body regions 705 and the gate electrode 706 that corresponds with the cross-sectional view of FIG. 5. While not specifically shown in FIG. 7, the gate electrodes 706 can be coupled with a gate connection grid, such as using the approaches described herein.

FIG. 8 illustrates a portion of a gate electrode 806 that includes fully connected hexagonal polysilicon features, e.g., interconnected hexagons, with hexagonal openings through which source/body regions 805 are exposed. Electrical contacts to the source/body regions 805 can be made through the openings in the gate electrode 806. The section line 5-5 in FIG. 8 indicates a portion of the source/body regions 805 and the gate electrode 806 that corresponds with the cross-sectional view of FIG. 5.

FIGS. 9A-9G are cross-sectional diagrams schematically illustrating operations of a manufacturing process for producing a vertical transistor with planar-gate electrodes. In FIGS. 9A-9G, as in FIGS. 4 and 5, the underlying semiconductor regions are not specifically shown. Also, the sequence of processing operations illustrated by FIGS. 9A-9G may be referred to back-of-line (BOL) processing operations. That is, the processing operations of the FIGS. 9A-9G illustrate the interconnection of segments of a vertical transistor that is disposed in a semiconductor region, where processing operations for producing the transistor segments can be referred to as front-of-line (FOL) processing. Specifically, referring to FIG. 9A, source/body regions 905 (such as discussed above with respect to FIG. 4-8) and corresponding gate electrodes 906 are already present, e.g., as a result of FOL processing operations. In some implementations, the transistor of FIGS. 9A-9G can be implemented using transistor segments, such as the vertical transistor segment 200, that are included in an active area, such as the active area 110 of the semiconductor device 100. As discussed above with respect to, e.g., FIG. 2, the gate electrodes 906 can have an underlying gate dielectric layer, which is not specifically shown in FIGS. 9A-9G.

Figure 9A:
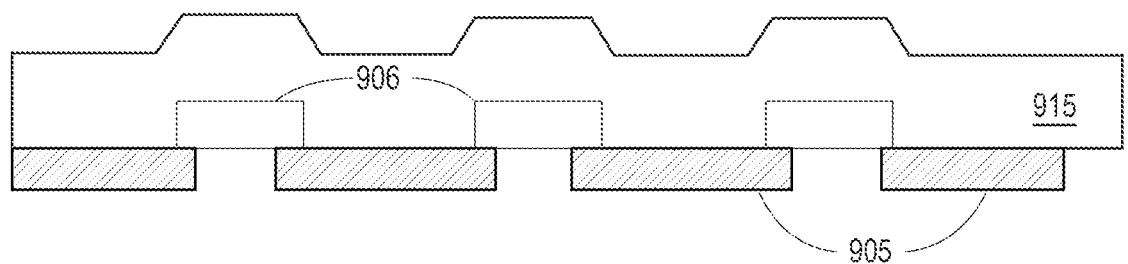
FIGS. 9A-9G are cross-sectional diagrams schematically illustrating a manufacturing process for a vertical transistor with planar-gate electrodes.
Figure 9B:
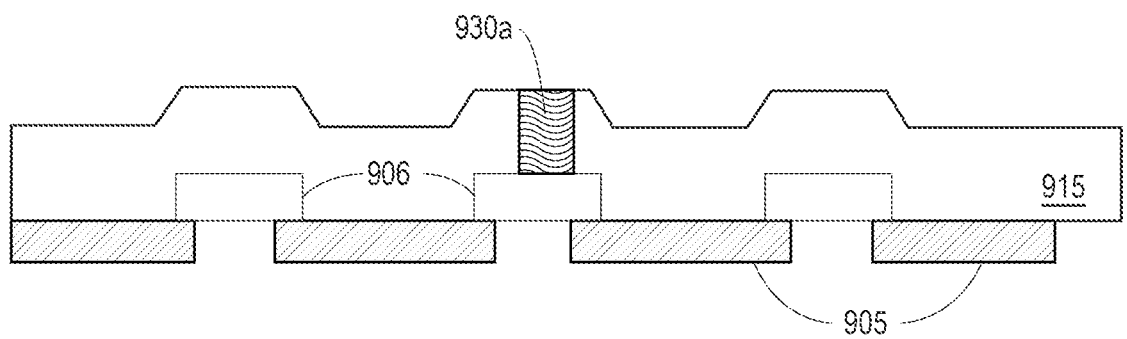

Referring to FIG. 9A, BOL processing can include, e.g., begin with, formation of a dielectric layer 915 on the vertical transistor segments produced during FOL processing. The dielectric layer 915 (as well as other dielectric layers discussed herein) can include a glass material, such as borophosphosilicate glass (BPSG), a deposited oxide, or other dielectric material. As shown in FIG. 9B, after forming the dielectric layer 915, at least one electrical contact 930a to one or more of the corresponding gate electrodes 906 can be formed through the dielectric layer dielectric layer 915. While only a single electrical contact 930a is visible in FIG. 9B (and related views), as noted above, other electrical contact 930a can be made to the gate electrodes 906 at other locations in an associated transistor device, such as at locations in a third dimension, either into or out of the page, or at locations lateral to the view in FIG. 9B e.g, in transistor segments implemented to the left and/or the right of the segments shown.

Figure 9C:
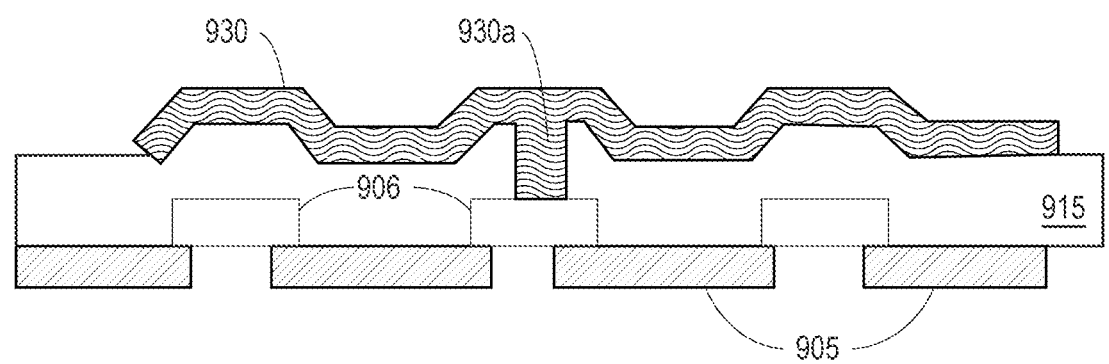
Figure 9D:
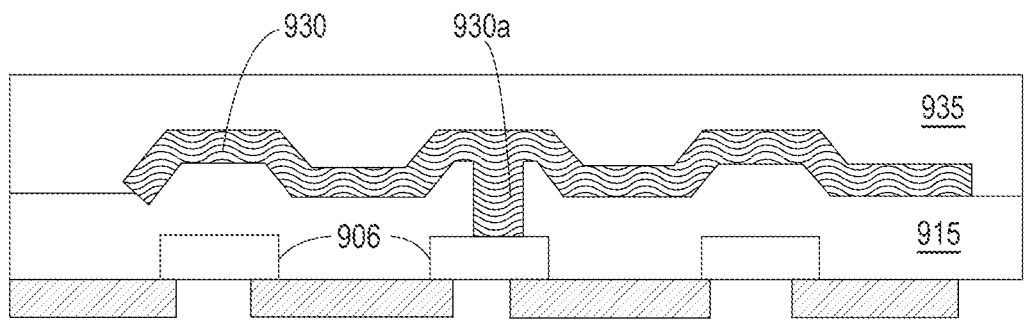

Referring to FIG. 9C, after forming the electrical contact 930a, and other such contacts, a gate connection grid 930 can be formed on the dielectric layer 915 and associated electrical contacts, such as the electrical contact 930a, to electrically couple the gate connection grid 930 with the gate electrodes 906. Moving to FIG. 9D, a dielectric layer 925 can be formed on the gate connection grid 930 and the dielectric layer 915. In some implementations, such as in this example, the dielectric layer 925 can be planarized (as could also be done with the dielectric 915 prior to forming the electrical contact 930a and the gate connection grid 930). Such planarization can include a chemical-mechanical polishing operation.

Figure 9E:
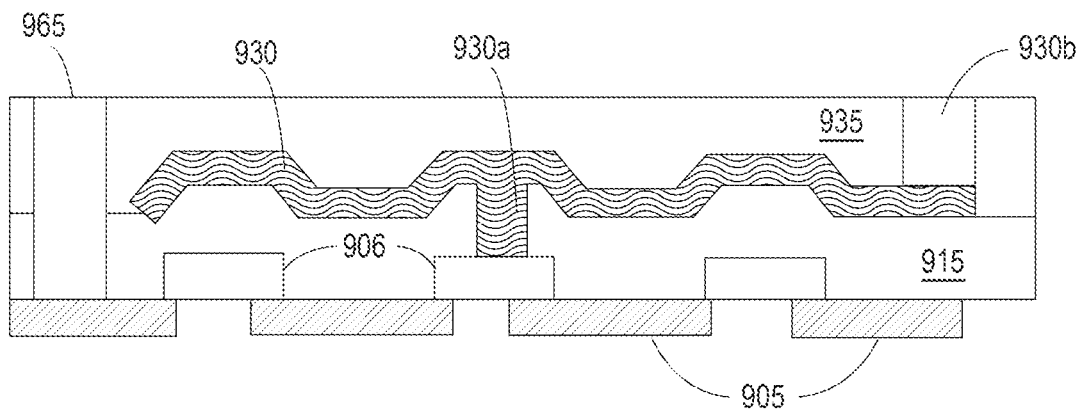

Referring to FIG. 9E, after planarizing the dielectric layer 925, electrical contacts 930b to the gate connection grid 930, as well as electrical contacts 965 to the body regions 905 can be formed. Again, even though only single electrical contacts 930b and 965 are shown in FIG. 9E, as well as in one or more related views, other such electrical contacts can be formed at other locations in an associated transistor device, such as at locations in a third dimension, either into or out of the page, or locations lateral to the view in FIG. 9E. In some implementation, the contacts can be formed using a same photolithography mask, or can be formed using different photolithography masks. In implementations, the order which the electrical contacts 930b and the electrical contacts 965 are formed will depend on the specific processing implementation.

Figure 9F:
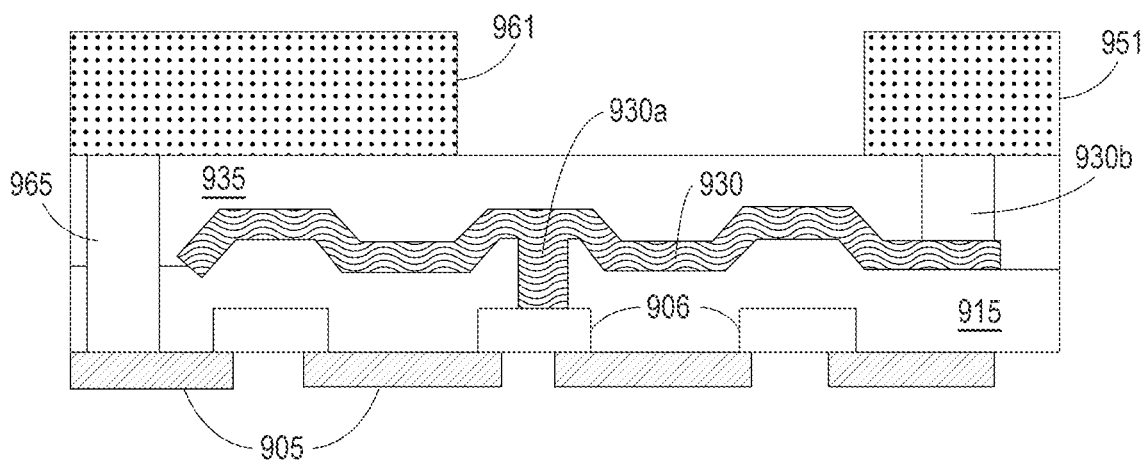

As shown in FIG. 9F, after forming the contacts 930b and 965, a signal metal layer (a first signal metal layer) can be formed that includes a first portion 951 that is electrically coupled with the electrical contact 930b, and can also be electrically coupled with other such contacts, to electrically couple the first portion 951 of the first signal metal layer to the gate connection grid 930. Accordingly, the first portion 951 is electrically coupled to the gate electrodes 906 through electrical contacts 930b, the gate connection grid 930, and electrical contacts 930a. The first signal metal layer can also include a second portion 961 that is electrically coupled with the electrical contact 965, and can also be electrically coupled with other such contacts. Accordingly, the second portion 961 is electrically coupled to the source/body regions 905 through electrical contacts 965.

Figure 9G:
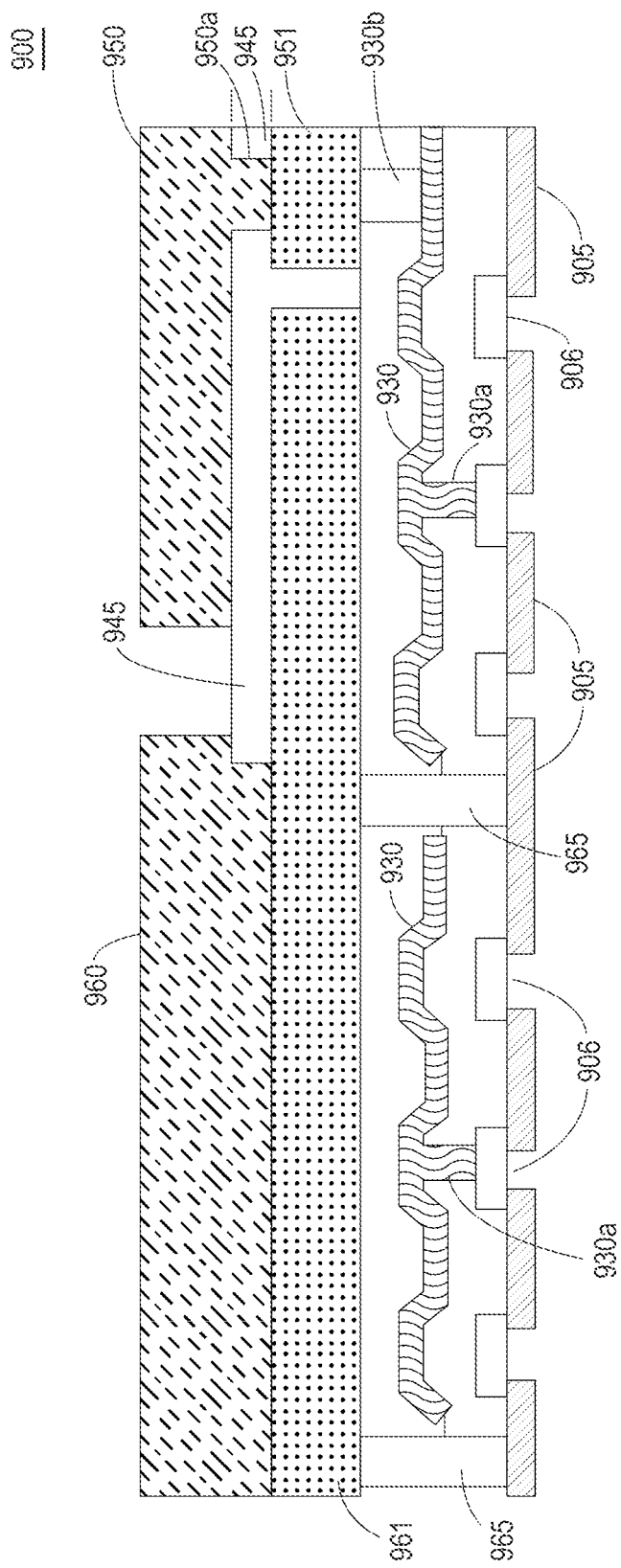

Referring to FIG. 9G, after forming the first signal metal layer, a dielectric layer 945 can be formed on the first signal metal layer and the dielectric layer 925, and a second signal metal layer can be formed on the first signal metal layer and on the dielectric layer 945. As shown in FIG. 9G, the second signal metal layer includes a first portion 950 that is electrically coupled with the first portion 951 of the first signal metal layer. In this example, the first portion 950 of the second signal metal layer is electrically coupled with the first portion 951 of the first signal metal layer through a conductive via 950a, though other approaches are possible. For example, the first portion 950 of the second signal metal layer can be directly disposed, at least in part, on the first portion 951 of the first signal metal layer. In this example, the first portion 950 of the second signal metal layer can be referred to as gate pad metal, and is electrically coupled to the gate electrodes 906 through the interconnection structure, including the gate connection grid 930, as shown in FIG. 9G, and described above.

As also shown in FIG. 9G, the second signal metal layer includes a second portion 960 that is electrically coupled with the first portion 961 of the first signal metal layer. In this example, the second portion 960 of the second signal metal layer is electrically coupled with the second portion 961 of the first signal metal layer as a result of being directly disposed, at least in part, on the second portion 961 of the first signal metal layer. In this example, the second portion 960 of the second signal metal layer can be referred to as source pad metal (or emitter pad metal), and is electrically coupled to the body regions 905 through the interconnection structure shown in FIG. 9G, and described above.

In FIG. 9G, a second, replicated transistor cell produced during FOL processing is illustrated to the left of, or lateral to the cell shown in FIGS. 9A-9F. Accordingly, FIG. 9F demonstrates replication of vertical transistor cells in an active area of an associated semiconductor device. As shown in FIG. 9G, the replicated cell is not shown as including a contact 930b to the gate signal metal, as the portion of the gate connection grid 930 in the replicated cell is disposed below source metal, e.g., the second portion 961 of the first signal metal layer. However, as described herein, the gate electrodes 906 included in the replicated cell can be electrically coupled with the first portion 951 of the first signal metal layer through the gate connection grid 930, as the gate connection grid 930 can extend over an associated active area, such as shown in FIG. 1.

As also shown in FIG. 9G, the first portion 951 of the first signal metal layer can extend under the first portion 950 of the second signal metal layer, which increases an amount of source signal metal (or emitter signal) metal, and can increase current carrying capability of an associated transistor. As noted above, the second signal metal layer (including the first portion 950 and the second portion 960) can be referred to as a signal distribution, or redistribution layer.

Figure 10:
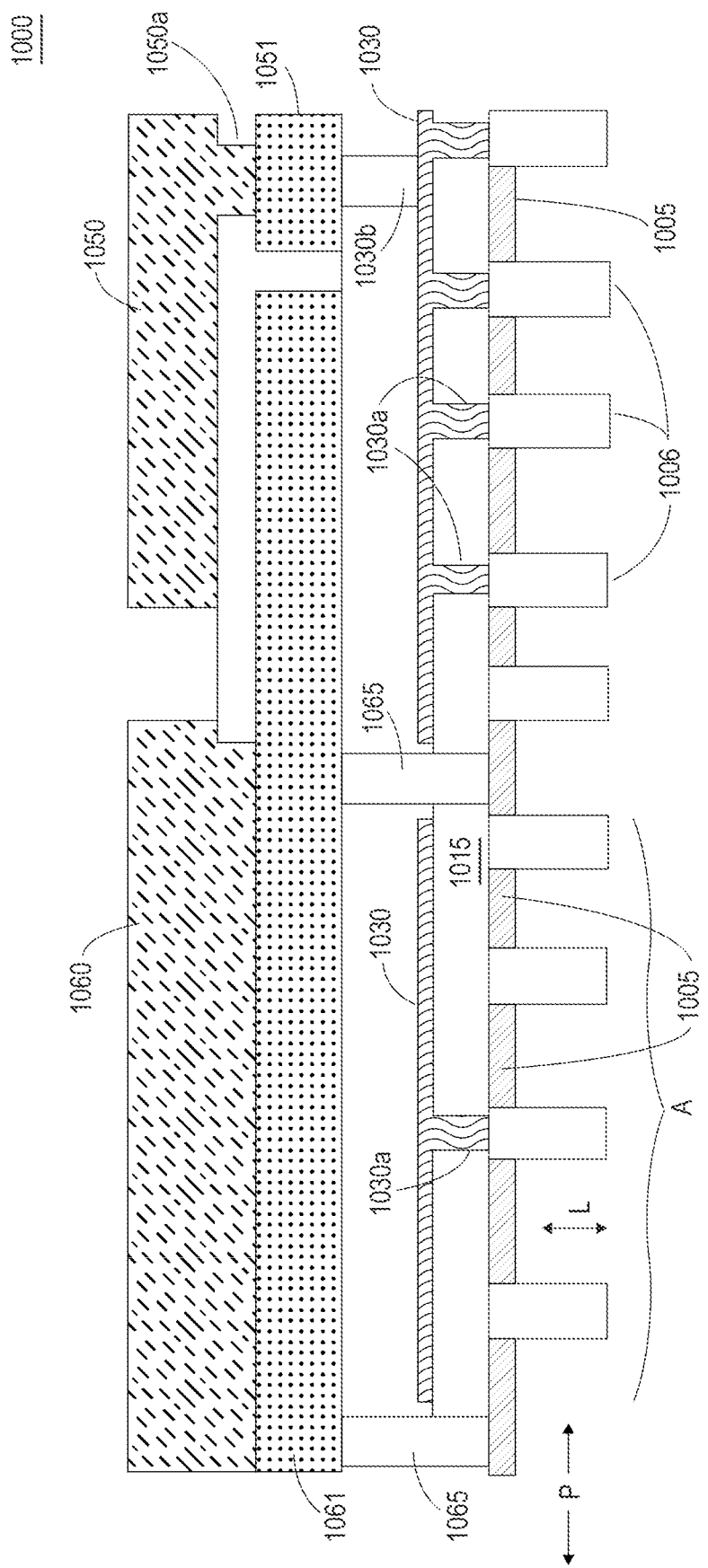
FIG. 10 is a cross-sectional diagram schematically illustrating a vertical device with trench-gate electrodes that can be produced using a process similar to the process of FIGS. 9A-9G.

FIG. 10 is a cross-sectional diagram schematically illustrating a vertical device with trench-gate electrodes that can be produced using a BOL process similar to the process of FIGS. 9A-9G. As the process to produce the vertical transistor of FIG. 10 is similar to the process of FIGS. 9A-9G, the details of that process are not described in detail again here. Instead differences in the structure of the transistor of FIG. 10 as compared to the transistor FIG. 9G are described below. Briefly, the transistor of FIG. 10, includes source/body regions 1005 (or emitter/body regions), trench-gate structures 1006, a dielectric layer 1015, a gate connection grid 1030, contacts 1030a, contact 1030b, contacts 1065, a first portion of a first signal metal layer 1051, a second portion 1061 of the first signal metal layer, a first portion of a second signal metal layer 1050, a conductive via 1050a, and a second portion 1060 of the second signal metal layer 1061. The transistor shown in FIG. 10 also includes other similar elements as the transistor of FIG. 9G, which are not specifically referenced in FIG. 10. Also, the elements referenced with 1000 series numbers in FIG. 10 correspond, respectively, with elements references with like 900 series number in FIG. 9.

Referring to FIG. 10, with further reference to FIG. 9G, the gate structures 1006 in FIG. 10 are trench gate structures, as compared to the planar-gates structures, including the gate electrodes 906, shown in FIGS. 9A-9G. Also in FIG. 10, the dielectric layer 1015 has a planar upper surface, which can be a result of the implementation of the trench-gate structures 1006 and/or planarization of the dielectric layer 1015. Accordingly, the gate connections grid 1030 is planar as compared to the conformal shape of the gate connection grid 930 on the surface of the dielectric layer 915.

As also shown in FIG. 10, a semiconductor substrate or semiconductor region in which the semiconductor device 1000 is implemented can be arranged along a plane P. In the example of FIG. 10, at least a portion of the gate connection grid 1030 and a portion of an active area A (e.g., respective portions of one or more segments of the vertical transistor) can be arranged along a line L that is orthogonal to the plane P. That is, conductors included in the gate connection grid

1030 can, along the line L, be disposed directly above active portions of the vertical transistor of the semiconductor device 1000.

In a general aspect, a semiconductor device can include a vertical transistor having a first transistor segment and a second transistor segment. The first transistor segment can include a first body region, a first source region, and a first gate electrode. The second transistor segment can include a second body region, a second source region, and a second gate electrode. The semiconductor device can further include a first dielectric layer disposed on the vertical transistor, and an electrically conductive grid disposed on the first dielectric layer. The electrically conductive grid can be electrically coupled with the first gate electrode and the second gate electrode using at least a first conductive contact formed through the first dielectric layer. The semiconductor device can also include a second dielectric layer disposed on the electrically conductive grid and the first dielectric layer, and a conductive metal layer disposed on the second dielectric layer. The conductive metal layer can include a first portion and a second portion. The first portion can be electrically coupled with the first body region, the first source region, the second body region, and the second source region using at least a second conductive contact formed through the first dielectric layer and the second dielectric layer. The second portion can be electrically coupled with the electrically conductive grid using at least a third conductive contact formed through the second dielectric layer.

Implementations can include one or more of the following features. For example, the first gate electrode can be a first planar-gate electrode, and the second gate electrode can be a second planar-gate electrode. The first gate electrode can be a first trench-gate electrode, and the second gate electrode can be a second trench-gate electrode.

The vertical transistor can be included in a semiconductor substrate. The semiconductor substrate can be arranged in a plane. At least a portion of the gate connection grid and a portion of the first segment of the vertical transistor can be arranged along a line that is orthogonal to the plane.

The metal layer can be first metal layer, and the semiconductor device can include a third dielectric layer disposed on the first metal layer and the second dielectric layer, and a second metal layer disposed on the third dielectric layer. The second metal layer can include a first portion that is electrically coupled with the first portion of the first metal layer through the third dielectric layer. The second metal layer can include a second portion that is electrically coupled with the second portion of the first metal layer through the third dielectric layer. The first portion of the second metal layer can be disposed on the first portion of the first metal layer. The second portion of the second metal layer can be electrically coupled with the second portion of the first metal layer using at least one conductive via formed through the third dielectric layer.

The electrically conductive grid and the first conductive contact can include tungsten. The first gate electrode and the second gate electrode can include doped polysilicon.

The vertical transistor can be included in a silicon carbide (SiC) semiconductor region. The first body region and the second body region can be of a first conductivity type, and can be disposed in the SiC semiconductor region. The SiC semiconductor region, the first source region and the second source region can be of a second conductivity type that is opposite the first conductivity type. The first source region can be disposed in the first body region, and the second source region can be disposed in the second body region.

The vertical transistor can include a vertical field-effect transistor (FET). The SiC semiconductor region can include a drift region of the vertical FET, and a drain region of the vertical FET.

The vertical transistor can include a vertical insulated gate bipolar transistor (IGBT). The first source region can be a first emitter region of the vertical IGBT, and the second source region can be a second emitter region of the vertical IGBT. The SiC semiconductor region can include a drift region of the vertical IGBT, and a collector region of the vertical IGBT.

The first gate electrode can be a first portion of a doped polysilicon gate electrode, and the second gate electrode can be a second portion the doped polysilicon gate electrode. The first gate electrode can be a first doped polysilicon gate electrode, and the second gate electrode is a second doped polysilicon gate electrode. The first doped polysilicon gate electrode can be electrically coupled with the second doped polysilicon gate electrode via the electrically conductive grid and respective electrical contacts to the electrically conductive grid.

The at least a first conductive contact formed through the first dielectric layer can include a first plurality of conductive contacts formed through the first dielectric layer. The at least a second conductive contact formed through the first dielectric layer and the second dielectric layer can include a second plurality of conductive contacts formed through the first dielectric layer and the second dielectric layer. The at least a third conductive contact formed through the second dielectric layer can include a third plurality of conductive contacts formed through the second dielectric layer.

In another general aspect, a semiconductor device can include a semiconductor region, an active region disposed in the semiconductor region, and an isolation region disposed in the semiconductor region. The isolation region can at least partially surround the active region. The semiconductor device can also include a plurality of vertical transistor segments disposed in the active region. The plurality of vertical transistor segments can include respective gate electrodes. The semiconductor device can also include a first dielectric layer disposed on the active region, and an electrically conductive grid disposed on the first dielectric layer. The electrically conductive grid can be electrically coupled with the respective gate electrodes using a plurality of conductive contacts formed through the first dielectric layer. The semiconductor device can further include a second dielectric layer disposed on the electrically conductive grid and the first dielectric layer, and a conductive metal layer disposed on the second dielectric layer. The conductive metal layer can include a portion that is electrically coupled with the respective gate electrodes through the electrically conductive grid using at least one conductive contact to the electrically conductive grid formed through the second dielectric layer.

Implementations can include one or more of the following features. For example, the metal layer can be a first metal layer. The semiconductor device can include a third dielectric layer disposed on the first metal layer and the second dielectric layer, and a second metal layer can include a portion that is electrically coupled with the portion of the first metal layer through the third dielectric layer.

The respective gate electrodes can include respective planar-gate electrodes. The respective gate electrodes can include respective trench-gate electrodes. The plurality of vertical transistor segments can include one of a plurality of vertical field-effect transistor segments, or a plurality of vertical insulated gate bipolar transistor segments. The gate connection grid may not reduce an active area of the active region.

In another general aspect, a method for producing a semiconductor device can include forming, in a semiconductor region, a vertical transistor. The vertical transistor can include a first transistor segment and a second transistor segment. The first transistor segment can have a first body region, a first source region, and a first gate electrode. The second transistor segment can have a second body region, a second source region, and a second gate electrode. The method can further include forming a first dielectric layer on the vertical transistor, and forming an electrically conductive grid on the first dielectric layer. The electrically conductive grid can be electrically coupled with the first gate electrode and the second gate electrode using at least a first conductive contact formed through the first dielectric layer. The method can also include forming a second dielectric layer on the electrically conductive grid and the first dielectric layer; and forming a conductive metal layer on the second dielectric layer. The conductive metal layer can include a first portion that can be electrically coupled with the first body region, the first source region, the second body region, and the second source region using at least a second conductive contact formed through the first dielectric layer and the second dielectric layer. The conductive metal layer can also include a second portion that can be electrically coupled with the electrically conductive grid using at least a third conductive contact formed through the second dielectric layer.

Implementations can include one or more of the following features. For example, the metal layer can be a first metal layer. The method can include forming a third dielectric layer on the first metal layer and the second dielectric layer, and forming a second metal layer on the third dielectric layer. The second metal layer can include a first portion that is electrically coupled with the first portion of the first metal layer through the third dielectric layer, and a second portion that is electrically coupled with the second portion of the first metal layer through the third dielectric layer.

It will be understood, for purposes of this disclosure, that when an element, such as a layer, a region, or a substrate, is referred to as being on, disposed on, connected to, electrically connected to, coupled to, or electrically coupled to another element, it may be directly on, connected or coupled to the other element, or one or more intervening elements may be present. In contrast, when an element is referred to as being directly on, directly disposed on, directly connected to, or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device comprising:
    a vertical transistor including:
        a first transistor segment having a first body region, a first source region, and a first gate electrode; and
        a second transistor segment having a second body region, a second source region, and a second gate electrode;
    a first dielectric layer disposed on the vertical transistor;
    an electrically conductive grid disposed on the first dielectric layer, the electrically conductive grid being electrically coupled with the first gate electrode and the second gate electrode using at least a first conductive contact formed through the first dielectric layer;
    a second dielectric layer disposed on the electrically conductive grid and the first dielectric layer; and
    a metal layer disposed on the second dielectric layer, the metal layer including:
        a first portion that is electrically coupled with the first body region, the first source region, the second body region, and the second source region using at least a second conductive contact formed through the first dielectric layer and the second dielectric layer; and
        a second portion that is electrically coupled with the electrically conductive grid using at least a third conductive contact formed through the second dielectric layer.

2. The semiconductor device of claim 1, wherein:
    the first gate electrode is one of a first planar-gate electrode or a first trench-gate electrode; and
    the second gate electrode is one a second planar-gate electrode or a second trench-gate electrode.

3. The semiconductor device of claim 1, wherein:
    the vertical transistor is included in a semiconductor substrate, the semiconductor substrate being arranged in a plane; and
    at least a portion of the electrically conductive grid and a portion of the first transistor segment being arranged along a line that is orthogonal to the plane.

4. The semiconductor device of claim 1, wherein the metal layer is first metal layer, the semiconductor device further comprising:

a third dielectric layer disposed on the first metal layer and the second dielectric layer; and a second metal layer disposed on the third dielectric layer, the second metal layer including:
- a first portion that is electrically coupled with the first portion of the first metal layer through the third dielectric layer; and
- a second portion that is electrically coupled with the second portion of the first metal layer through the third dielectric layer.

5. The semiconductor device of claim 4, wherein:
the first portion of the second metal layer is disposed on the first portion of the first metal layer; and
the second portion of the second metal layer is electrically coupled with the second portion of the first metal layer using at least one conductive via formed through the third dielectric layer.

6. The semiconductor device of claim 1, wherein:
the electrically conductive grid and the first conductive contact include tungsten; and
the first gate electrode and the second gate electrode include doped polysilicon.

7. The semiconductor device of claim 1, wherein the vertical transistor is included in a silicon carbide (SiC) semiconductor region.

8. The semiconductor device of claim 7, wherein:
the first body region is of a first conductivity type and disposed in the SiC semiconductor region;
the second body region is of the first conductivity type and disposed in the SiC semiconductor region;
the SiC semiconductor region, the first source region and the second source region are of a second conductivity type that is opposite the first conductivity type;
the first source region is disposed in the first body region; and
the second source region is disposed in the second body region.

9. The semiconductor device of claim 7, wherein:
the vertical transistor includes a vertical field-effect transistor (FET); and
the SiC semiconductor region includes:
- a drift region of the vertical FET; and
- a drain region of the vertical FET.

10. The semiconductor device of claim 7, wherein:
the vertical transistor includes a vertical insulated gate bipolar transistor (IGBT),
the first source region including a first emitter region of the vertical IGBT,
the second source region including a second emitter region of the vertical IGBT, and
the SiC semiconductor region including:
- a drift region of the vertical IGBT; and
- a collector region of the vertical IGBT.

11. The semiconductor device of claim 1, wherein:
the first gate electrode is a first portion of a doped polysilicon gate electrode; and
the second gate electrode is a second portion the doped polysilicon gate electrode.

12. The semiconductor device of claim 1, wherein:
the first gate electrode is a first doped polysilicon gate electrode; and
the second gate electrode is a second doped polysilicon gate electrode,
the first doped polysilicon gate electrode being electrically coupled with the second doped polysilicon gate electrode via the electrically conductive grid and respective electrical contacts to the electrically conductive grid.

13. The semiconductor device of claim 1, wherein:
the at least the first conductive contact formed through the first dielectric layer is included in a first plurality of conductive contacts formed through the first dielectric layer;
the at least the second conductive contact formed through the first dielectric layer and the second dielectric layer is included in a second plurality of conductive contacts formed through the first dielectric layer and the second dielectric layer; and
the at least the third conductive contact formed through the second dielectric layer is included in a third plurality of conductive contacts formed through the second dielectric layer.

14. A semiconductor device comprising:
a semiconductor region;
an active region disposed in the semiconductor region;
an isolation region disposed in the semiconductor region, the isolation region at least partially surrounding the active region;
a plurality of vertical transistor segments disposed in the active region, the plurality of vertical transistor segments including respective gate electrodes;
a first dielectric layer disposed on the active region;
an electrically conductive grid disposed on the first dielectric layer, the electrically conductive grid being electrically coupled with the respective gate electrodes using a plurality of conductive contacts formed through the first dielectric layer;
a second dielectric layer disposed on the electrically conductive grid and the first dielectric layer; and
a metal layer disposed on the second dielectric layer, the metal layer including a portion that is electrically coupled with the respective gate electrodes through the electrically conductive grid using at least one conductive contact to the electrically conductive grid formed through the second dielectric layer.

15. The semiconductor device of claim 14, wherein the metal layer is a first metal layer, the semiconductor device further comprising:
a third dielectric layer disposed on the first metal layer and the second dielectric layer; and
a second metal layer including a portion that is electrically coupled with the portion of the first metal layer through the third dielectric layer.

16. The semiconductor device of claim 14, wherein the respective gate electrodes include respective planar-gate electrodes or respective trench-gate electrodes.

17. The semiconductor device of claim 14, wherein the electrically conductive grid does not reduce an active area of the active region.

18. The semiconductor device of claim 14, wherein the plurality of vertical transistor segments includes one of:
a plurality of vertical field-effect transistor segments; or
a plurality of vertical insulated gate bipolar transistor segments.

19. A method for producing a semiconductor device, the method comprising:
forming, in a semiconductor region, a vertical transistor including:
a first transistor segment having a first body region, a first source region, and a first gate electrode; and a second transistor segment having a second body region, a second source region, and a second gate electrode;

forming a first dielectric layer on the vertical transistor;

forming an electrically conductive grid on the first dielectric layer, the electrically conductive grid being electrically coupled with the first gate electrode and the second gate electrode using at least a first conductive contact formed through the first dielectric layer;

forming a second dielectric layer on the electrically conductive grid and the first dielectric layer; and forming a metal layer on the second dielectric layer, the metal layer including:
a first portion that is electrically coupled with the first body region, the first source region, the second body region, and the second source region using at least a second conductive contact formed through the first dielectric layer and the second dielectric layer; and
a second portion that is electrically coupled with the electrically conductive grid using at least a third conductive contact formed through the second dielectric layer.

20. The method of claim 19, wherein the metal layer is a first metal layer, the method further comprising:

forming a third dielectric layer on the first metal layer and the second dielectric layer; and forming a second metal layer on the third dielectric layer, the second metal layer including:
a first portion that is electrically coupled with the first portion of the first metal layer through the third dielectric layer; and
a second portion that is electrically coupled with the second portion of the first metal layer through the third dielectric layer.

* * * * *